(12) United States Patent
Fork et al.

(10) Patent No.: US 9,102,084 B2
(45) Date of Patent: *Aug. 11, 2015

(54) SOLAR CELL WITH HIGH ASPECT RATIO GRIDLINES SUPPORTED BETWEEN CO-EXTRUDED SUPPORT STRUCTURES

(75) Inventors: David K. Fork, Mountain View, CA (US); Thomas Hantschel, Menlo Park, CA (US)

(73) Assignee: SolarWorld Innovations GmbH, Freiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/818,712

(22) Filed: Jun. 18, 2010

(65) Prior Publication Data

US 2010/0252104 A1 Oct. 7, 2010

Related U.S. Application Data

(62) Division of application No. 11/282,882, filed on Nov. 17, 2005, now Pat. No. 7,765,949.

(51) Int. Cl.
*H01L 31/00* (2006.01)
*B41M 5/00* (2006.01)
(Continued)

(52) U.S. Cl.
CPC ............. *B29C 47/026* (2013.01); *B29C 47/065* (2013.01); *B29C 47/145* (2013.01);
(Continued)

(58) Field of Classification Search
CPC .. B29C 47/026; B29C 47/065; B29C 47/145; B29C 47/707; B29C 47/705; H01L 31/022452; H01L 31/18; Y02E 10/50; B81C 1/00634; B81C 2900/02; Y10T 428/24802

USPC ........................................ 136/256; 428/195.1
See application file for complete search history.

(56) References Cited

U.S. PATENT DOCUMENTS 2,031,387 A    2/1936    Schwarz
2,326,803 A    8/1943    Samiran
(Continued)

FOREIGN PATENT DOCUMENTS

EP    1351318 A2    10/2003
EP    1787786 A    5/2007
(Continued)

OTHER PUBLICATIONS

Finlayson et al. "Bi2O3—Wo3 compounds for photocatalytic applications by solid state and viscous processing", Title from a conference scheduled for Oct. 6-7, 2004 in Munich, 8 pages.

(Continued)

*Primary Examiner* — Tamir Ayad

(57) ABSTRACT

A solar cell structure formed by extruding/dispensing materials on a substrate such that centrally disposed conductive high aspect ratio line structures (gridlines) are formed on the substrate surface with localized support structures coincidentally disposed on opposing side surfaces of the gridlines such that the gridlines are surrounded or otherwise supported by the localized support structures. In one embodiment the localized support structures are transparent, remain on the substrate after the co-extrusion process, and are covered by a layer of material. In another embodiment, the localized support structures are sacrificial support structures that are removed as part of the solar cell structure manufacturing process. In both cases the co-extrusion process is performed such that both the central gridline and the localized support structures are in direct contact with the surface of the substrate.

11 Claims, 9 Drawing Sheets

(51) Int. Cl.
  *B44C 1/17* (2006.01)
  *G03G 7/00* (2006.01)
  *B29C 47/02* (2006.01)
  *B29C 47/06* (2006.01)
  *B29C 47/14* (2006.01)
  *B29C 47/70* (2006.01)
  *B81C 1/00* (2006.01)
  *H01L 31/0224* (2006.01)
  *H01L 31/18* (2006.01)
  *B29C 47/00* (2006.01)

(52) U.S. Cl.
  CPC ............. *B29C47/705* (2013.01); *B29C 47/707* (2013.01); *B81C 1/00634* (2013.01); *H01L 31/022425* (2013.01); *H01L 31/18* (2013.01); *B29C 47/0021* (2013.01); *B81C 2900/02* (2013.01); *Y02E 10/50* (2013.01); *Y10T 428/24802* (2015.01)

(56) References Cited

U.S. PATENT DOCUMENTS

| | | | |
|---|---|---|---|
| 2,761,791 A | 9/1956 | Russell | |
| 2,789,731 A | 4/1957 | Marraffino | |
| 3,032,008 A | 5/1962 | Land et al. | |
| 3,159,313 A | 12/1964 | Guilford | |
| 3,602,193 A | 8/1971 | Adams et al. | |
| 4,018,367 A | 4/1977 | Morine et al. | |
| 4,119,058 A | 10/1978 | Schmermund | |
| 4,141,231 A | 2/1979 | Kudlich | |
| 4,254,894 A | 3/1981 | Fetters | |
| 4,388,346 A * | 6/1983 | Bickler | 438/98 |
| 4,420,510 A | 12/1983 | Kunkel et al. | |
| 4,461,403 A | 7/1984 | Prahs | |
| 4,476,165 A | 10/1984 | McIntyre | |
| 4,490,418 A | 12/1984 | Yoshida | |
| 4,521,457 A | 6/1985 | Russell et al. | |
| 4,602,120 A | 7/1986 | Wakefield et al. | |
| 4,743,484 A * | 5/1988 | Robbins | 428/106 |
| 4,747,517 A | 5/1988 | Hart | |
| 4,826,777 A | 5/1989 | Ondris | |
| 4,938,994 A | 7/1990 | Choinski | |
| 4,976,999 A | 12/1990 | Ishizuka | |
| 4,985,715 A | 1/1991 | Cyphert et al. | |
| 5,000,988 A | 3/1991 | Inoue et al. | |
| 5,011,565 A | 4/1991 | Dube et al. | |
| 5,120,484 A | 6/1992 | Cloeren | |
| 5,151,377 A | 9/1992 | Hanoka et al. | |
| 5,188,789 A | 2/1993 | Nishiura | |
| 5,216,543 A * | 6/1993 | Calhoun | 359/619 |
| 5,254,388 A | 10/1993 | Melby et al. | |
| 5,279,682 A * | 1/1994 | Wald et al. | 136/256 |
| 5,353,813 A | 10/1994 | Deevi et al. | |
| 5,449,413 A | 9/1995 | Beauchamp et al. | |
| 5,536,313 A | 7/1996 | Watanabe et al. | |
| 5,543,333 A | 8/1996 | Holdermann | |
| 5,560,518 A | 10/1996 | Catterall et al. | |
| 5,590,818 A | 1/1997 | Raba et al. | |
| 5,605,720 A | 2/1997 | Allen et al. | |
| 5,679,379 A | 10/1997 | Fabricante et al. | |
| 5,700,325 A | 12/1997 | Watanabe | |
| 5,733,608 A | 3/1998 | Kessel et al. | |
| 5,873,495 A | 2/1999 | Saint-Germain | |
| 5,913,147 A | 6/1999 | Dubin et al. | |
| 5,914,138 A | 6/1999 | Swenson | |
| 5,918,771 A | 7/1999 | van der Heijden | |
| 6,047,862 A | 4/2000 | Davies | |
| 6,121,542 A * | 9/2000 | Shiotsuka et al. | 136/256 |
| 6,257,450 B1 | 7/2001 | Jackson et al. | |
| 6,284,090 B1 * | 9/2001 | Vesterlund et al. | 156/314 |
| 6,293,498 B1 | 9/2001 | Stanko et al. | |
| 6,323,415 B1 | 11/2001 | Uematsu et al. | |
| 6,375,311 B1 | 4/2002 | Kuramoto | |
| 6,398,370 B1 | 6/2002 | Chiu et al. | |
| 6,410,843 B1 | 6/2002 | Kishi et al. | |
| 6,418,986 B1 | 7/2002 | Gabriele | |
| 6,423,140 B1 | 7/2002 | Liu et al. | |
| 6,529,220 B1 | 3/2003 | Matsumoto | |
| 6,558,146 B1 | 5/2003 | Shah et al. | |
| 6,666,165 B2 | 12/2003 | Shiraishi et al. | |
| 6,743,478 B1 | 6/2004 | Kiiha et al. | |
| 6,890,167 B1 | 5/2005 | Kwok et al. | |
| 7,101,592 B2 | 9/2006 | Gueggi et al. | |
| 7,394,016 B2 | 7/2008 | Gronet | |
| 2001/0053420 A1 | 12/2001 | Donges et al. | |
| 2002/0083895 A1 | 7/2002 | Nakamura et al. | |
| 2002/0122928 A1 * | 9/2002 | Botrie et al. | 428/304.4 |
| 2003/0015820 A1 | 1/2003 | Yamazaki et al. | |
| 2003/0032214 A1 | 2/2003 | Huang | |
| 2003/0201581 A1 | 10/2003 | Weber et al. | |
| 2004/0259382 A1 | 12/2004 | Nishimura et al. | |
| 2004/0265407 A1 | 12/2004 | Prugh et al. | |
| 2005/0000566 A1 | 1/2005 | Posthuma et al. | |
| 2005/0067729 A1 | 3/2005 | Laver et al. | |
| 2005/0127541 A1 | 6/2005 | Spurgeon et al. | |
| 2005/0133084 A1 | 6/2005 | Joge et al. | |
| 2005/0194037 A1 | 9/2005 | Asai | |
| 2005/0221613 A1 | 10/2005 | Ozaki et al. | |
| 2007/0023081 A1 | 2/2007 | Johnson et al. | |
| 2007/0108229 A1 | 5/2007 | Fork et al. | |
| 2007/0110836 A1 | 5/2007 | Fork et al. | |
| 2007/0186970 A1 | 8/2007 | Takahashi et al. | |
| 2007/0207694 A1 | 9/2007 | Yoda et al. | |
| 2008/0041436 A1 | 2/2008 | Lau et al. | |
| 2008/0138456 A1 | 6/2008 | Fork et al. | |

FOREIGN PATENT DOCUMENTS

| | | |
|---|---|---|
| EP | 1833099 A2 | 9/2007 |
| JP | 60082680 A | 5/1985 |
| JP | 05-031786 A | 2/1993 |
| JP | 9223499 A | 8/1997 |
| JP | 11076898 A | 3/1999 |
| JP | 11307791 A | 11/1999 |
| JP | 2000200799 A | 7/2000 |
| JP | 2002086047 A | 3/2002 |
| JP | 2002111035 A | 4/2002 |
| JP | 2004006565 A | 1/2004 |
| JP | 2004174489 A | 6/2004 |
| JP | 2004266023 A | 9/2004 |
| JP | 2004281813 A | 10/2004 |
| JP | 2005051216 | 2/2005 |
| JP | 2005116906 A | 4/2005 |
| JP | 2005166914 A | 6/2005 |
| JP | 2006100527 A | 4/2006 |
| JP | 2008266981 A | 11/2008 |
| KR | 20000048647 A | 7/2000 |
| TW | 200531822 A | 10/2005 |
| WO | 91/15355 | 10/1991 |
| WO | 00/50215 | 8/2000 |
| WO | 03/076701 A | 9/2003 |
| WO | 2005052974 A1 | 6/2005 |
| WO | 2005/070224 A1 | 8/2005 |
| WO | 2005/107957 A1 | 11/2005 |
| WO | 2005/107958 A1 | 11/2005 |
| WO | 2006097303 A1 | 9/2006 |

OTHER PUBLICATIONS

Mueller et al. "Breathable Polymer Films Produced by the Microlayer Coextrusion Process", Journal of Applied Polymer Science, vol. 78, pp. 816-828, 2000.

Schweizer, Peter M. "Curtain Coating Technology Can Mean Big Benefits", Paper, Film & Foil Converter website, Mar. 1, 2000, 5 pages, http://pffc-online.com/mag/paper_curtain_coating_technology/.

Extrusion/Coextrusion Dies, Extrusion Dies Industries, LLC, http://www.extrusiondies.com/Products/ExtrusionDies/multimanifold-Dies.html, 1 page.

Citsco, Gimac Compact Triplex TR12 Micro-Coextrusion Plant, NPE 2000, Jun. 19-23, 2000, McCormick Place, Chicago, IL, Booth 13154, http://www.citsco.com/NPE2000/npepagel.html, 2 pages.

(56) References Cited

OTHER PUBLICATIONS

Rao et al. "Microfabricated Deposition Nozzles for Direct-Write Assembly of Three-Dimensional Periodic Structures", Advanced Materials, vol. 17, No. 3, Feb. 10, 2005, pp. 289-293.

Van Hoy et al. "Microfabrication of Ceramics by Co-extrusion", J. Am. Ceram. Soc., vol. 81, No. 1, pp. 152-158, 1998.

Huebner et al., "Novel cost-effective bifacial silicon solar cells with 19,4% fron and 18.1% rear efficiency", Feb. 1997, American Institute of Physics, Applied Physics Letters 70 (8), 24, pp. 1008-1010.

Nijs et al., "Overview of solar cell technologies and results on high efficiency multicrystalline silicon substrates", Solar Energy Materials and Solar Cells, Elsevier Science Publishers, Amsterdam, NL, Nov. 1, 1997, pp. 199-217.

Brogren et al, "Optical properties, durability, and system aspects of a new aluminium-polymer-laminated stell reflector for solar concentrators", Solar Energy Materials & Solar Cells 82, Jan. 13, 2004, pp. 387-412.

Mauk et al., "Buried Metal/ Dielectric/ Semiconductor Reflectors for Light Trapping in Epitaxial Thin-Film Solar Cells", IEEE, May, 1996, 25th PVSC, Washington DC, pp. 147-150.

Muenzer et al., "Thin Monocrystalline Silicon Solar Cells", IEEE Transactions on Electron Devices, vol. 46, No. 10, Oct. 1999, pp. 2055-2061.

English Language Abstract for JP 11307791 A. Nov. 5, 1999.
English Language Abstract for JP 2004281813 A. Oct. 10, 2004.
English Language Abstract for JP 2000200799 A. Jul. 18, 2000.
English Language Abstract for JP 2004006565 A. Jan. 8, 2004.
English Language Abstract for JP 2006100527 A. Apr. 13, 2006.
English Language Abstract for JP 9223499 A. Aug. 26, 1997.
English Language Abstract for JP 2008266981 A. Nov. 6, 2008.
English Language Abstract for JP 2002086047 A. Mar. 26, 2002.
English Language Abstract for JP 11076898 A. Mar. 23, 1999.
English Language Abstract for JP 2004174489 A. Jun. 24, 2004.
English language abstract of JP 2005166914 A dated Jun. 23, 2005.

* cited by examiner

SOLAR CELL WITH HIGH ASPECT RATIO GRIDLINES SUPPORTED BETWEEN CO-EXTRUDED SUPPORT STRUCTURES

CROSS REFERENCE TO RELATED PATENTS AND APPLICATIONS

This application is a divisional of U.S. patent application Ser. No. 11/282,882 filed on Nov. 17, 2005 and entitled "EXTRUSION/DISPENSING SYSTEMS AND METHODS", and is related to U.S. patent application Ser. No. 11/282,829 filed on Nov. 17, 2005 and entitled "EXTRUSION/DISPENSING MULTIPLE MATERIALS TO FORM HIGH-ASPECT RATIO EXTRUDED STRUCTURES" (as amended).

BACKGROUND

The following generally relates to solar cells having gridlines formed by co-extrusion systems and methods. More particularly, it is directed to solar cells having gridlines formed by micro extrusion systems and methods for co-extruding multiple similar and/or dissimilar materials to form relatively fine gridline structures with relatively high aspect ratios. However, other applications are also contemplated herein.

With traditional extrusion a billet of material is pushed and/or drawn through a die to create a rod, rail, pipe, etc. Various applications leverage this capability. For instance, extrusion can be used with food processing applications to create pasta, cereal, snacks, etc., pipe pastry filling (e.g., meringue), pattern cookie dough on a cookie pan, generate pastry flowers and borders on cakes, etc. In another application, extrusion can be used with consumer goods, for example, to merge different colored toothpastes together on a toothbrush.

However, conventional extrusion techniques are limited. For example, conventional techniques cannot render relatively high aspect-ratio (e.g., 10:1) fine featured (e.g., less then 5 micron) porous (e.g., 0.01 mm RMS) structures for a cost below $1/sq. ft. Thus, extrusion typically is not used for creating conducting contacts and/or channels for electrochemical (e.g., fuel), solar, and/or other types of cells, which leverage high aspect-ratio fine featured porous structures to increase efficiency and electrical power generation.

By way of example, with fuel cells high aspect-ratio fine featured porous electrolyte structures provide a long reaction zone that increases utilization of the expensive catalyst needed for the electrode. In addition, fuel cells can be complex structures since they perform multiple functions including: conducting protons from the membrane to the reaction site; diffusing oxygen to the reaction site with a low partial pressure drop; conducting electrons from the porous electrode to the reaction site; carrying heat away from the reaction site; and withstanding a compressive mechanical load of about 100-200 PSI. Conventional extrusion techniques cannot meet these demands at a cost demanded by the fuel cell industry. In order to increase efficiency, fuel cell manufacturers use more catalyst than desired to increase the number of reaction sites and make agglomerates of carbon catalyzed with Platinum (Pt) in a matrix of porous, or polytetrafluoroethylene (PTFE). With solar cells, high aspect-ratio fine featured grid lines reduce the amount of shading, which allows more photons to be captured, resulting in an increased electrical power generation. Conventional extrusion techniques are not able to produce such grid lines at a cost demanded by the solar cell industry.

BRIEF DESCRIPTION

In one aspect, a solar cell structure is formed by extruding/dispensing materials on a substrate such that centrally disposed conductive high aspect ratio line structures (gridlines) are formed on the substrate surface with localized support structures coincidentally disposed on opposing side surfaces of the gridlines, and such that the gridlines are surrounded or otherwise supported by the localized support structures. In one embodiment the localized support structures are transparent, remain on the substrate after the co-extrusion process, and are covered by a layer of material. In another embodiment, the localized support structures are sacrificial support structures that are removed as part of the solar cell structure manufacturing process. In both cases the co-extrusion process is performed such that both the central gridline and the localized support structures are in direct contact with the surface of the substrate.

DETAILED DESCRIPTION

Figure 1:
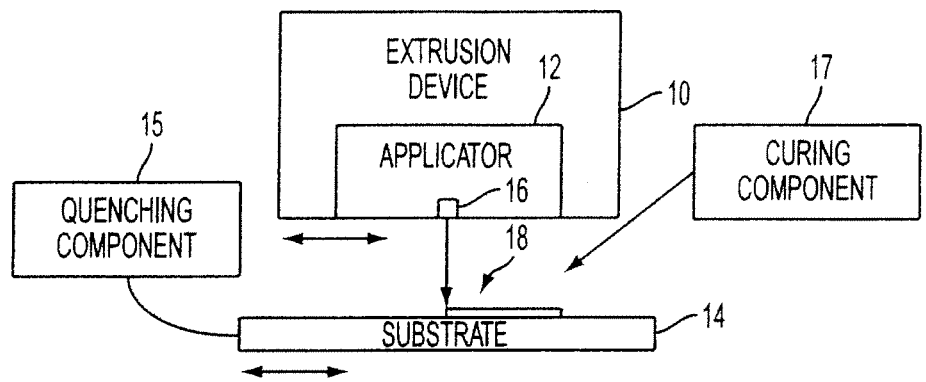
FIG. 1 illustrates an extrusion device with an applicator for concurrently applying one or more materials on a substrate.

FIG. 1 illustrates an extrusion device 10 with an applicator 12 for concurrently applying two or more substantially similar and/or different materials (e.g., fluids, pastes, liquids, inks, etc.) on a substrate 14. The materials are applied through pushing and/or drawing techniques (e.g., hot and cold) in which the materials are pushed (e.g., squeezed, etc.) and/or drawn (e.g., via a vacuum, etc.) through the applicator 12 and out one or more dispensing openings 16 of the applicator 12. The materials are dispensed to create one or more variously shaped entities (e.g., continuous, multi-sectional, rectangular, triangular, irregular, etc.) on the substrate 14. Suitable entities include, but are not limited to, a bead, a point, a track, a pipe, a frame, a rail, a rod, a seal, a volume within a void, etc. The shape of the entity can be defined through at least one of the shapes of the one or more dispensing openings 16, the structure within the applicator 12 (e.g., channels), characteristics of the materials (e.g., viscosity, etc.), and the extrusion technique (e.g., flow rate, pressure, temperature, etc.). Suitable materials include, but are not limited to, silver, copper, aluminum, steel, plastic, ceramic, oil, etc., combinations thereof, and/or variations thereof, including combining the above with other substances to obtain a desired density, viscosity, texture, color, etc.

By way of example, multiple materials (e.g., with a viscosity from about 1 centipoise (cP) to about several hundred thousand cP) can be pushed and/or pulled through the applicator 12 and dispensed together to produce one or more structured layers of the materials on the substrate 14. The multiple materials can be pushed and/or pulled through the applicator 12 under laminar flow in order to mitigate mixing of the materials. Mixing can be further reduced by using substantially immiscible materials, including mixing a material with one or more other materials, impurities, dopants, coatings, etc. to create pastes, etc. In some instances, the materials can be prepared such that they are mutually insoluble, enabling striped layers to be extruded onto the substrate 14 through the applicator 12 with relatively little mixing. The viscosities of the materials can also be matched to reduce shear and mixing between flows.

The applicator 12 can be a nozzle, a die, or any structure that receives materials and facilitates applying the materials to the substrate 14. The applicator 12 can be micro-machined with structures that receive and converge individual materials. For instance, the applicator 12 can include N channels, where N is an integer equal to or greater than one (e.g., thousands), for merging materials within the applicator 12 into a single flow dispensed by the applicator 12. Each of the N channels can be used for introducing a different material and/or multiple channels can be used for introducing a substantially similar material. Where the applicator 12 includes a single channel, the different material can be introduced through similar and/or different ports into the channel.

Each channel can extend through a length (e.g., the entire length or a subset thereof) of the applicator 12. For instance, one or more of the N channels can be designed to be shorter than the length of the applicator 12, but relatively longer than an entrance length in order to produce laminar flow, wherein flow velocity is stabilized prior to merging materials. This can be achieved through known micro-machining techniques such as deep reactive ion etching, wafer bonding, etc. As briefly discussed above, creating the applicator 12 for laminar flow mitigates and/or minimizes mixing of materials as the materials traverse through the applicator 12 and out of its opening. The N channels may also be shaped to counteract the effects of surface tension on the materials as they progress from applicator 12 to the substrate 14. Each channel may be uniquely and/or similarly shaped, including uniform and/or non-uniform shapes.

To deposit the entity (e.g., bead, point, etc.) onto the substrate 14, the applicator 12 is suitably positioned with respect to the substrate 14, and the one or more materials are dispensed through the applicator 12. Such positioning can be based on factors such as distance between the applicator 12 and the substrate 14, the angle of the dispensing end of the applicator 12 with respect to the substrate 14 (e.g., from parallel to perpendicular to the substrate 14), etc. in order to increase transfer efficiency, entity definition (e.g., width, height, length, diameter, etc), entity characteristics (e.g., strength, pliability, etc.), etc. In addition, such positioning may result in contact between the applicator 12 and the substrate 14. FIG. 1 depicts the applicator 12 positioned above the substrate 14 during dispensing.

Prior to, during, and/or after dispensing the materials on the substrate 14, the device 10 and the applicator 12 and/or the substrate 14 can be moved. For example, to create a point (or dot, ball, etc.) at a particular location on the substrate 14, the device 10 and applicator 12 and/or the substrate 14 can be moved and suitably positioned. Subsequently, the materials can be dispensed to create the point. Thereafter, the device 10 and applicator 12 and/or the substrate 14 can be moved to another position for a subsequent application, if any. In another example, to create a bead the device 10 and applicator 12 and/or the substrate 14 can be moved to an initial position. During dispensing of the materials on the substrate 14, the device 10 and applicator 12 and/or the substrate 14 can be moved in a suitable direction to facilitate forming the bead on the substrate 14. FIG. 1 depicts the applicator 12 dispensing a flow of materials to form a continuous bead on the substrate 14 as depicted at reference numeral 18.

To limit the tendency for the materials to intermix after extrusion, the bead of material leaving the applicator 12 can be quenched on the substrate 14 by making the substrate 14 relatively cold with respect to the applicator 12. For example, a quenching component 15 can be used to cool the substrate 14. In another technique, the materials can be cured by thermal, optical and/or other means upon exit from the applicator 12. For example, a curing component 17 can thermally and/or optically cure the materials. If one or both materials includes an ultraviolet curing agent, the material can be bound up into solid form in order to enable further processing without mixing.

The applicator 12 can be manufactured a variety of ways. For instance, via deep silicon reactive ion etching and wafer bonding. In another instance, the applicator 12 can be manufactured by electroplating metal up through features in a patterned resist structure. In another instance, the applicator 12 can be manufactured by brazing together layers of etched sheet metal. In yet another instance, the applicator 12 can be manufactured by generating structures out of photo-definable polymer such as SUB. In still another instance, the applicator 12 can be machined or molded out of metal and/or plastic using conventional manufacturing techniques.

The relative speed of the motion between the applicator 12 and the substrate 14 and the speed at which the materials are dispensed determine characteristics such as whether the material is stretched or compressed as it is placed on the substrate 14. These rates also determine a thickness and/or an average thickness of the extruded material. Typically, these rates are set based at least in part on one or more of the application, the materials, and/or the substrate 14. For example, these rates may be set to minimize separation between adjacent materials and/or deviations from desired dimensions. Airflow may be used to direct one or more materials onto the substrate 14. For example, airflow around the dispensing opening of the applicator 12 can be provided to pull the materials in desired directions. If the substrate is porous, as in the case of some fuel cell electrodes, airflow (e.g., a vacuum) can be pulled through the substrate 14 to increase attachment of the material to the substrate 14. Flow can also be controlled through controlling a pressure, temperature, etc. of the applicator 12 and/or the substrate 14 to achieve the desired flow properties of the material being extruded.

The duty cycle of each dispensed material can be controlled by adjusting a corresponding pressure of each material entering the applicator 12 in which each pressure can be similar and/or different. Additionally and/or alternatively, the duty cycle can be determined by the design of the applicator 12. For instance, the pitch of each dispensed material can be defined by a geometry of the applicator 12 (e.g., a width of the opening, a number of channels, shape of the channels, etc.). Both the pitch and the duty cycle can be configured for a particular design. For example, with one application the widths of the dispensed materials may be substantially similar. With another application, a width of one or more of the materials may be different. In yet another application, one or more groups of channels may have different widths wherein the channels within any one group may have substantially similar widths. Because surface tension forces may distort the pitch of the material (e.g., at the edges), the pitch of each channel can be adjusted to compensate.

The one or more materials can be pre-filled within one or more storage elements (not shown) associated with the device 10. For instance, the materials may be stored together in a similar storage element and/or separated into individual storage elements. Additionally and/or alternatively, the materials may be supplied to the device 10 before and/or during extrusion via one or more optional input ports (not shown) of the device 10.

Figure 18:
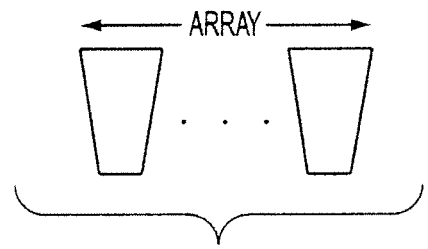
FIG. 18 illustrates a serial array of applicators.
Figure 19:
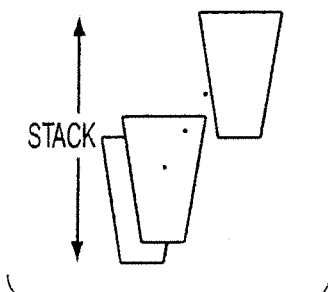
FIG. 19 illustrates stacked applicators.
Figure 20:
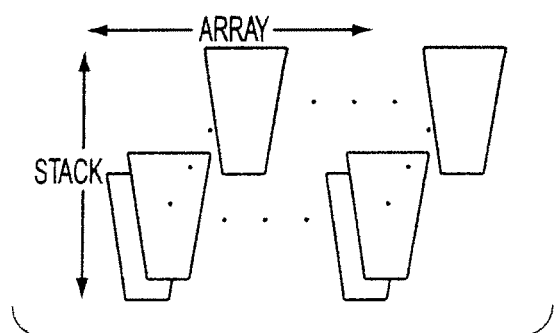
FIG. 20 illustrates a matrix of applicators.

It is to be appreciated that the device 10 may include more than one applicator 12. Suitable configurations include, but are not limited to, a serial array of applicators 12 (e.g., staggered, adjacent, etc.), for example to increase a width of a single pass; stacked applicators 12, for example to apply multiple layers in a single pass; a matrix of applicators (serial array/stacked combination) to concurrently increase the width and the number of layers, for example to increase efficiency, etc. Examples of such configurations are depicted in FIGS. 18, 19, and 20.

Each applicator 12 may be used to dispense a plurality of materials. For instance, substantially all of the applicators 12 could dispense similar materials. In another instance, the materials dispensed by one the applicators 12 may be different from the materials dispensed by one or more other applicators 12. In yet another example, each of the applicators 12 could dispense different materials, wherein the materials dispensed by any one applicator 12 may be similar and/or different. In still another example, each of the applicators 12 may only dispense a single material.

The multiple applicators 12 can be configured such that the device 10 dispenses the materials in an interleaved and/or adjacent manner. Thus, a first applicator 12 dispensing K materials (where K is an integer equal to or greater than two) may dispense K adjacent materials, K materials with gaps in between, and/or some combination thereof. A second applicator 12 dispensing L materials (where L is an integer equal to or greater than two) may dispense L adjacent materials next to the K adjacent materials, L materials within the gaps between the K materials, and/or some combination thereof. A third, fourth, etc. applicator 12 can be similarly used to apply materials in connection with the K and L materials.

The device 10 can be used in connection with a variety of applications. For example, the device 10 can be used to create solar and/or electrochemical (e.g., fuel, battery, etc.) cell electrodes. For instance, the device 10 can be used to extrude lines of the silver paste into a high aspect ratio grid lines surrounded by a sacrificial material that is in place only as long as it is needed to maintain the shape of the electrode on a solar cell substrate before or during any processing such as drying, curing, and/or sintering. A further advantage of the sacrificial material is that the added material leads to an overall larger output orifice, and hence a lower pressure drop for a given material flow speed. Higher process speed is therefore achievable. A further advantage when convergent flow is used is that a minimum fabrication feature of the device 10 is larger than the minimum feature of an extruded gridline.

In addition to striped materials with a lateral variation, variations of the applicator 12 can be used to additionally and/or alternatively introduce materials with a vertical variation, for example, for introducing barrier layers onto the substrate 14. Such vertical variation can be implemented by forming channels that converge dissimilar materials together in the vertical direction within the manifold. For instance, with a solar cell application, it may be advantageous to introduce a metal bi-layer onto the cell surface with one metal making contact to the silicon as a diffusion barrier, and a second metal on top selected for either lower cost or higher conductance.

In another example, the device 10 can be used to facilitate manufacturing light control films such as those used for computer privacy screens. Typically, such screens have a series of tall, thin opaque louver layers in a clear matrix to limit the optical transmission to a narrow range of angles. The applicator 12 could dispense alternating layers of opaque and clear materials to form a layer of louvers by molding a ridge pattern into plastic and pressing a black matrix in between the ridges, wherein the two structures can be laminated together. In yet another example, the device 10 can be used to print striated structures with a high aspect ratio such as artificial muscle. For instance, lateral co-extrusion in combination with a valving scheme could be used to make such structures. Multiple bands of muscle like material could be laid out in varied directions to produce a variety of actuations.

In another example, the device 10 and the applicator 12 can be used for printing. For instance, by utilizing multi-pass printing, with or without registration, systems could be developed to create thicker layers, or layers with a wider mix of materials, or functional composite materials with novel properties. The process direction can also be changed from layer to layer in order to create unique structures. For example, the device 10 and the applicator 12 could be used to create high strength plastics with crisscrossing grain structures similar to plywood. The device 10 and the applicator 12 enables printing a wide range of materials with viscosities up to the order several hundred thousand cP, with high aspect ratios on the order of 10:1 and features as small as 100 nanometers. Conventional jet printing technology is limited to materials with viscosities of about 40 cP and below and can not make high aspect ratio features or features less than tens of microns.

It is to be appreciated that employing the applicator 12 can reduce costs. For instance, typical costs associated with fabricating electrodes of a fuel cell can be reduced $10 to $20 per square foot of electrode area. Further, a wide array of materials ranging from paints, waxes, colloidal suspensions, pastes, resists, particle suspensions, gels, thixotropic materials, etc. can be extruded through the applicator 12. The materials are not limited by the viscosity and/or by the need to form a vapor as with thermal inkjet, and more than one material can be dispensed simultaneously. The convergent applicator 12 can produce feature sizes with lateral dimensions on the order of 100 nanometers. The thickness of a layer (e.g., about 50 microns) can be variously applied and since the materials typically are not ejected in a drop-wise fashion, large volumes of material can be printed in a single pass. With conventional systems, drops of low viscosity liquid ejected from a print head flatten out against a substrate, making low-aspect features. The printed mark would essentially become a 2D feature if the surface was to get wet. The applicator 12 can apply pastes to render three dimensional (3D) structures with relatively high aspect ratio, for example, 10:1 for fuel cell applications, which is virtually impossible with conventional inkjet technology.

It will be appreciated that a productivity of a co-extrusion process typically depends on the dispense rate of the fluids and that for a fixed nozzle pressure, the dispense rate is lower for fluids of higher viscosity. In order to achieve a high process throughput, a low viscosity is desired. On the other hand, in order to produce a co-extruded composite material with well defined interfaces and an overall shape that follows the nozzle geometry, a high viscosity is desired. One way to achieve high nozzle throughput and shape retention is to dispense shear-thinning fluids. Such, non-Newtonian fluids, generally lower their viscosity in the presence of a shear stress, sometimes by large amounts, even by factors of 100 in some cases for example as described in Rao et al., Adv. Materials vol. 17 no. 3 (2005).

Figure 2:
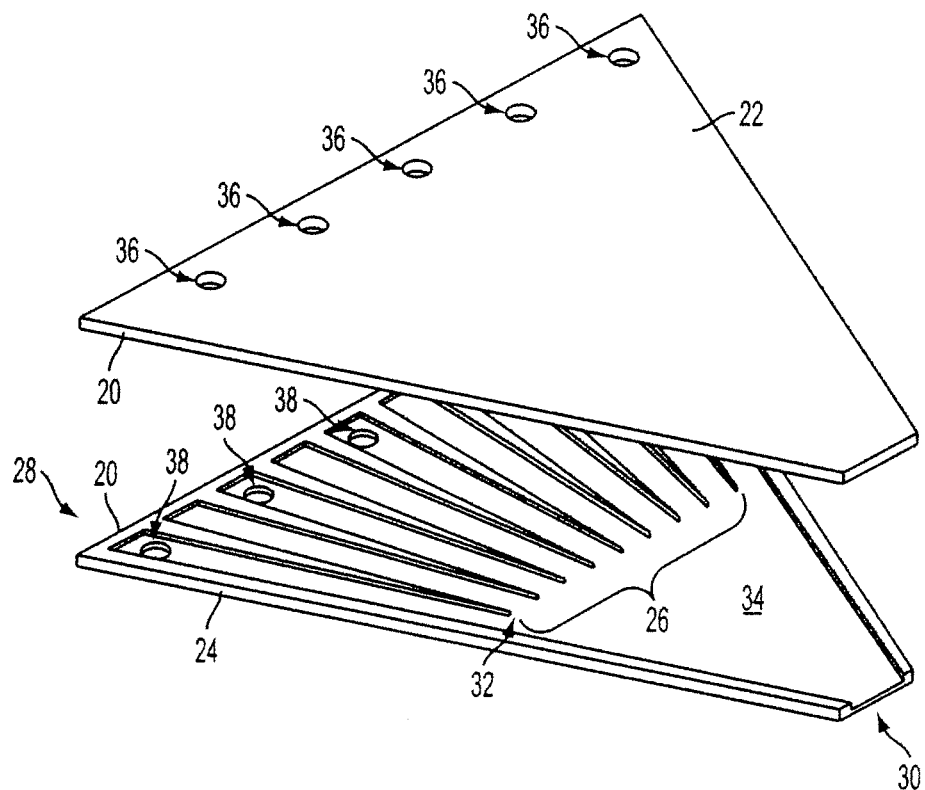
FIG. 2 illustrates an exemplary applicator that can be with the device of FIG. 1.

FIG. 2 illustrates an exemplary applicator that can be used as the applicator 12 of the device 10. It is to be appreciated that this example is provided for explanatory purposes and is not limiting; other applicator configurations and/or variations are also contemplated.

The applicator includes a manifold 20 having a first side 22 and a second side 24. The manifold 20 can be fabricated by known micro-machining techniques such as deep reactive ion etching and wafer bonding, for example. Each of the halves 22 and 24 can include M channels 26, wherein M is an integer equal to or greater than one (e.g., thousands or more). For clarity and explanatory purposes, ten channels are shown. The channels 26 typically are machined to extend a defined length of the manifold 20. For instance, the channels 26 may be fabricated to be relatively longer than an entrance length to create laminar flow, but less then the entire length of the manifold 20, as illustrated. The channels 26 can also be machined to create similar and/or different shaped uniform and/or non-uniform channels.

The sides 22 and 24 are depicted as two independent structures; however, the manifold 20 can be created as a single unit and/or more than two pieces (e.g., each of the sides 22 and 24 may be formed from multiple components). When the sides 22 and 24 are together, each of the channels 26 forms one or more isolated compartments, conduits, passageways, etc. beginning at a first end 28 of the manifold 20 and extending toward a second end 30 of the manifold 20 up to a region 32 where the channels 26 terminate and converge into a single volume 34. In other instances, the compartments, conduits, passageways, etc. formed by the channels 26 may not be isolated such that materials flowing through adjacent channels may come into contact with each other.

The manifold 20 further includes ports for receiving materials. As depicted, a plurality of ports 36 can be interleaved and located on the first side 22, and a plurality of ports 38 can be interleaved and located on the second side 24. In other instances, the ports 36 and 38 can all be located on one and/or both of the sides 22 and 24 of the manifold 20. In one instance, a single material may be fed into all of the ports 36 and 38. In another instance, a different material may be fed into each of the ports 36 and 38. In yet another instance, one or more materials may be fed into the ports 36 on the first side 22 of the manifold 20, and one or more different materials may be fed into the ports 38 on the second side 24 of the manifold 20.

The different materials traverse through respective channels 26 and merge within the region 34 of the manifold 20 to form a single flow comprising multiple materials in which adjacent materials within the flow originate from adjacent channels and can be similar and/or different materials. Under laminar flow conditions, the materials traversing through the channels 26 and merging in the region 34 typically do not mix or there is relatively minimal mixing of the materials. As discussed previously, the viscosities of the materials can be matched in order to reduce shear and mixing between the materials. In addition, the channels 26 may be shaped to counteract the effects of surface tension on a material as it progresses out of the manifold 20.

The manifold 20 and/or M channels 26 can be variously shaped to facilitate producing laminar flow, merging different materials, and/or producing a desired shape on the substrate 14. As depicted, a suitable manifold shape includes a trapezoidal shape with channels extending and/or tapering from the first end 28 of the manifold 20 to the second end 30 of the manifold.

Figure 3:
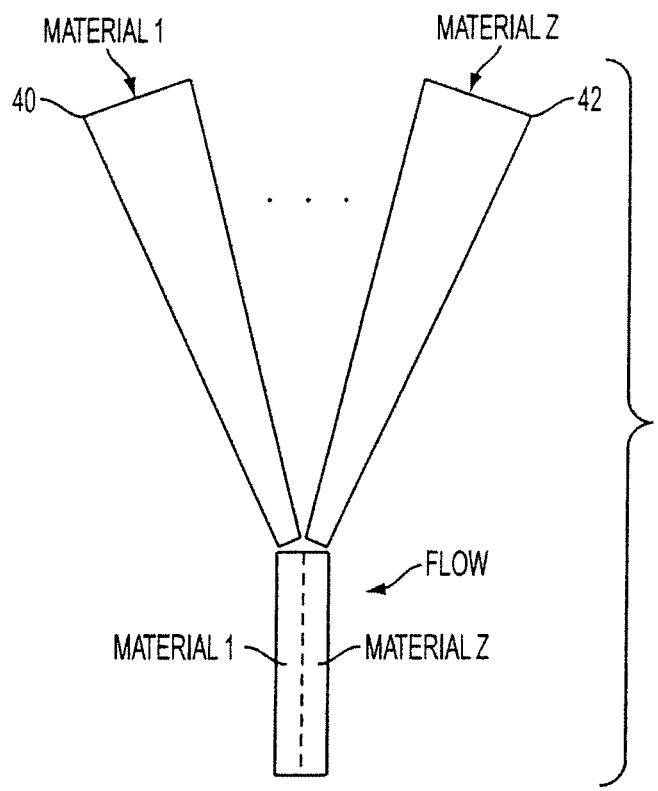
FIG. 3 illustrates another exemplary applicator that can be used with the device of FIG. 1.
Figure 4:
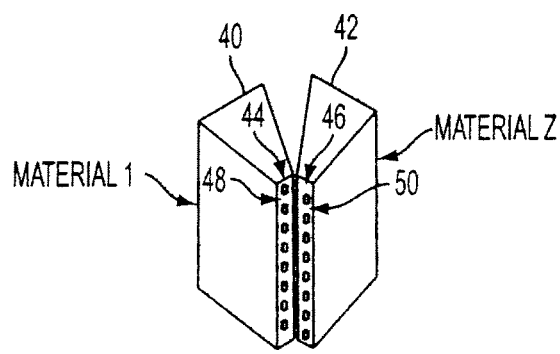
FIG. 4 illustrates a plurality of dispensing ports associated with the applicator described in FIG. 3.

FIGS. 3 and 4 illustrate another exemplary applicator that can be used as the applicator 12 of the device 10. Referring initially to FIG. 3, separate structures are used to dispense each material. As depicted, a dispenser 40 is used to apply a first material, and a dispenser 42 is used to apply a Zth material, wherein Z is an integer equal to or greater than one. The dispensers 40 and 42 can be positioned relative to each other by micro-positioners and/or other suitable drives. Alignment from channel-to-channel can also be achieved by interlocking features built into the dispensers 40 and 42, such as comb-like structures. Since the materials come into contact outside of the dispensers 40 and 42, the materials can be partially intermixable if the materials can be cured relatively rapidly after being dispensed onto the substrate 14 (e.g. UV-curing). For instance, the materials can be co-mingled into a layer in flight between the channel tips and the substrate 14. Alternately, separate stripes on the substrate 14 may flow together once the materials are deposited on the substrate 14.

FIG. 4 shows that each of the dispensers 40 and 42 can include one or more dispensing ports. The dispenser ports 44 are used to apply the first material, and the dispenser ports 46 are used to apply the Zth material. The ports 44 can be separated by a plurality of (equal or non-equal) gaps 48 for applying a plurality of flows of first material. The ports 44 can be offset parallel to the ports 44 and separated by a plurality of (equal or non-equal) gaps 50 in order to facilitate dispensing the Zth material in the gaps 44 to render a flow comprising alternating materials with a width based on an aggregate number of the ports 44 and 46.

Figure 5:
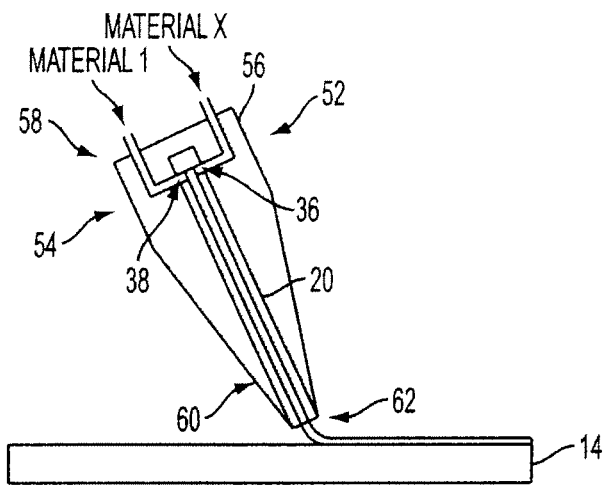
FIG. 5 illustrates another exemplary configuration of an applicator that can be used the device of FIG. 1.

FIG. 5 illustrates another exemplary configuration of an applicator that can be used as the applicator 12. In this example, the applicator is used to apply two different materials on the substrate 14. The applicator includes the manifold 20, which, as described above, includes a plurality of channels 26 that are fabricated to facilitate creating laminar flow in order to merge materials received in each channel 26 within the manifold 20 into a single flow of separate materials (with material to material contact) while mitigating mixing of the materials. The channels 26 are associated with either the ports 36 or the ports 38, which are used to introduce at least one of the materials into the manifold 20. Two such ports are illustrated.

Typically, the two different materials are introduced into the manifold 20 in an interleaved manner such that adjacent channels 26 are used for different materials. However, similar materials can be introduced into adjacent channels. As depicted, the two different materials can be introduced into the manifold 20 from opposing sides 52 and 54. In other configurations, the two different materials can be introduced from a substantially similar side(s) (e.g., either the side 52 or the side 54), including introducing both materials from multiple sides (e.g., both the side 52 and the side 54). The side in which a material is introduced may be arbitrary or defined in order to establish a particular sequence.

As illustrated, a first material is supplied to some of the channels 26 of the manifold 20 through one or more of the plurality of ports 38, and another material is supplied to different channels 26 of the manifold 20 through the plurality of ports 36. It is to be appreciated the relative position of the ports 36 and 38 with respect to each other can be arbitrary such that the manifold 20 could be turned 180 degrees. As described above, the materials traverse (e.g., via a push, a pull, etc. technique) through corresponding channels and merge under laminar flow within the manifold 20 to form a single flow of materials.

The applicator further includes a housing 56, which reinforces the exterior of the applicator. The housing 56 can be designed to taper, or diminish in size (e.g., thickness, diameter, width, etc.) from a back region 58 to a front region 60. Such tapering provides relatively more support at the back region 58, which typically includes the highest pressure regions of the applicator, while enabling a dispensing end 62 to be positioned adjacent to and/or in contact with the substrate 14. Such positioning can be based on factors such as distance between the applicator and the substrate 14, the angle of the dispensing end 62 with respect to the substrate 14, etc.

The applicator and/or the substrate 14 can be moved in order facilitate applying the materials to the substrate 14. The relatively narrower dispensing end 62 enables multiple applicators to be arrayed together in a staggered or non-staggered arrangement to increase a width of material applied with each pass of the applicators across the substrate 14. The substrate 14 can be fed as cut sheets or in a roll-to-roll process. The flow speed of the material can be controlled as described above. For example, the pressure of the materials can be suitably adjusted to effectuate the flow speed.

Figure 6:
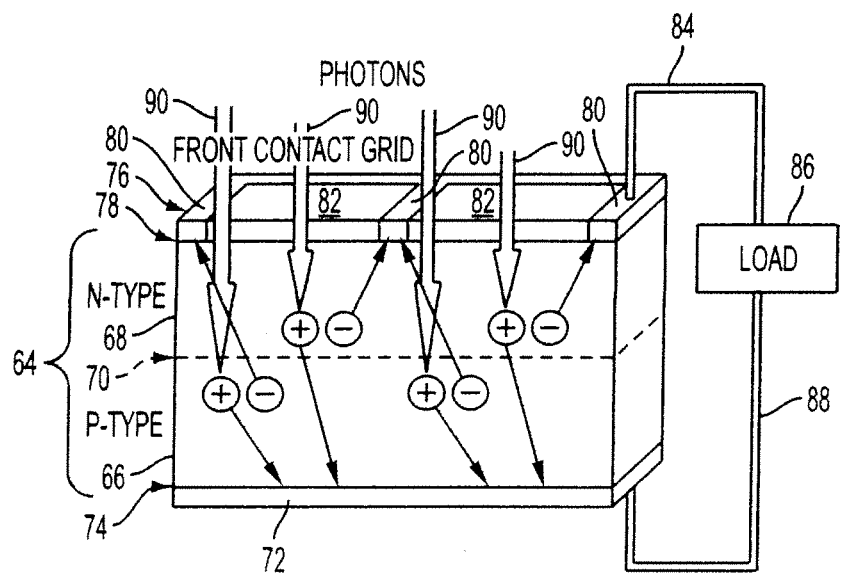
FIG. 6 illustrates an exemplary portion of a photovoltaic cell with grid lines created via the applicator of FIG. 1.

FIG. 6 illustrates an exemplary portion of a photovoltaic cell, such as a solar cell, with grid lines created via the applicator 12. The photovoltaic cell includes a semiconductor 64 with a p-type region 66 and an n-type region 68. One or both of the regions 66 and 68 of the semiconductor 64 can be formed from semiconductor materials such as, for example, Aluminium Arsenide, Aluminium Gallium Arsenide, Boron Nitride, Cadmium Sulfide, Cadmium Selenide, Diamond, Gallium Arsenide, Gallium Nitride, Germanium, Indium Phosphide, Silicon, Silicon Carbide, Silicon Germanium, Silicon on insulator, Zinc Sulfide, Zinc Selenide, etc. An electric field is created across a p-n junction 70 and allows electrons and/or holes to flow from one region to another region of the semiconductor 64, for example, upon the absorption of a photon. Electrons pass from the n-type region 68 into the p-type region 66, and holes pass from the p-type region 66 to the n-type region 68.

The photovoltaic cell further includes a contact 72 formed adjacent to a side 74 of the p-type region 66. The contact 72 can be formed via a metal paste such as an aluminum based paste. A grid contact 76 is formed adjacent to a side 78 of the n-type region 68. The grid contact 76 includes conducting fingers 80 separated by non-conducting regions 82. The fingers 80 can be formed via a metal paste such as a silver based paste. The contacts 72 and/or 76 may be exposed to a heat treatment, and/or drying, curing, and/or sintering, and/or other processes.

After the contacts 72 and 76 are created, a plurality of the cells can be interconnected in series and/or parallel, for example, via flat wires or metal ribbons, and assembled into modules or panels. A sheet of tempered glass (not shown) may be layered over the grid contact 76 and/or a polymer encapsulation (not shown) may be formed over the contacts 72. The photon absorbing surface may include a textured surface and/or be coated with an antireflection material (e.g., silicon nitride, titanium dioxide, etc.) in order to increase the amount of light absorbed into the cell. In addition, the grid contract 76 can be formed as rectangular bars or variously shaped, for example, as triangular volumes (e.g., with the point of the triangle facing away from the semiconductor 64) that facilitate directing photons into the semiconductor 64 and mitigating blocking photons from entering the semiconductor 64, which can improve efficiency and/or generation of electrical power.

A electrode 84 can be connected to the grid contacts 76 and an external load 86, and an electrode 88 can be connected to the external load 86 and the contact 72. When photons 90 are absorbed into the semiconductor 64, their energy excites electrons therein, which subsequently freely move. Electrical current is generated when excited electrons in the n-type region 68 travel through the grid contact 76 and the electrode 84 to the external load 86 and back through the electrode 88 and the contact 72 to the p-type region 72.

Figure 7:
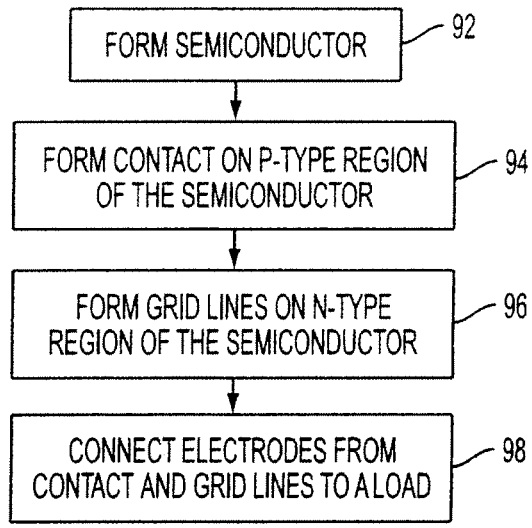
FIG. 7 illustrates a method for fabricating the photovoltaic cell described in FIG. 6.

FIG. 7 illustrates a method for fabricating grid lines on a photovoltaic device such as the photovoltaic cell described in connection with FIG. 6. At reference numeral 92, a semiconductor is formed. The semiconductor can include various semiconductor materials as described above. For instance, the semiconductor can be formed by coupling a piece of n-type silicon with a piece of p-type silicon to form a semiconductor p-n junction. In another instance, an n-type dopant (e.g., Phosphorus, Arsenic, Antimony, etc.) or a p-type dopant (e.g., Boron, etc.) is diffused into a side of a silicon wafer. In yet another instance, naturally occurring semiconductors such as blue diamonds, which contain Boron impurities, can be used. One or more of the photovoltaic cells can optionally be coupled in a serial and/or parallel manner to create a photovoltaic module or panel. At 94, a conducting contact is formed adjacent to the p-type region via known techniques. At 96, a conducting grid is formed adjacent to the n-type region. In one example, the device 10, as described above, is used to form the conducting grid. At 98, electrodes are coupled from the conducting contact and the conducting grid to a load. When photons are absorbed into the semiconductor, electrical energy is generated via the photovoltaic effect.

Figure 8:
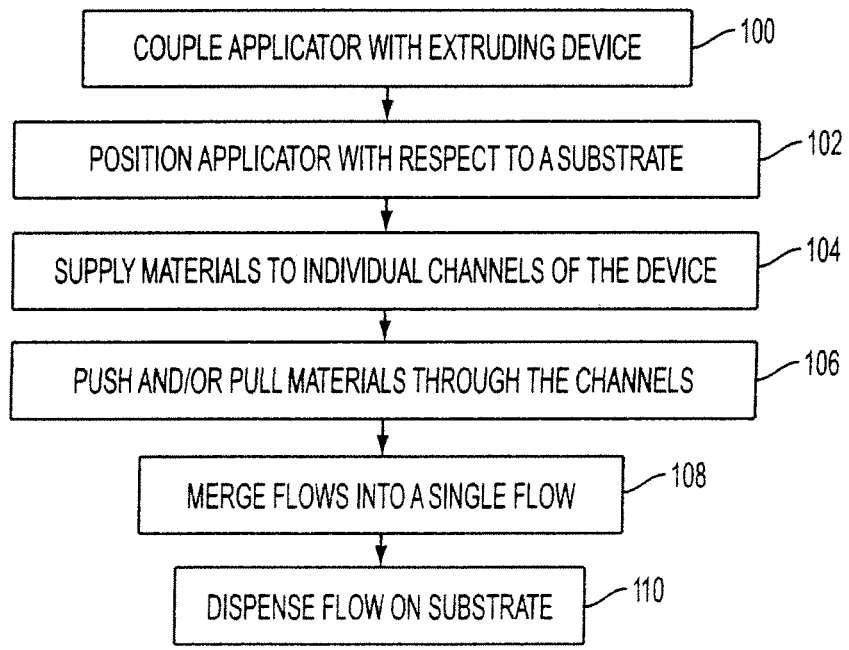
FIG. 8 illustrates a method for fabricating grid lines of the photovoltaic cell described in FIG. 6.

FIG. 8 illustrates a method for fabricating the grid lines of the photovoltaic device describe in connection with FIG. 6. At reference numeral 100, one or more applicators (e.g., the applicators 12) can be coupled to an extruding device (e.g., the device 10). It is to be appreciated that the applicators can be coupled in a serial (e.g., staggered or non-staggered) and/or parallel manner in order to increase the width of each pass and/or concurrently apply multiple layers. At 102, the device can be suitably positioned with respect to a surface of the photovoltaic substrate. Such positioning includes a distance between dispensing ends of the applicators and the photovoltaic device, an angle of the dispensing ends of the applicators with respect to the photovoltaic substrate, etc.

At 104, a silver paste and a sacrificial material (e.g., a material used to maintain a shape of the electrodes) are fed into the applicators. It is to be appreciated that the silver paste and sacrificial materials can be pushed and/or drawn into the applicators through known techniques. Each of the applicators can include a plurality of channels fabricated to facilitate producing laminar flow for merging materials within the applicators while mitigating mixing of such materials. The silver paste and the sacrificial material typically are fed in an interleaved manner such that adjacent channels are fed different materials (e.g., one channel is fed silver paste while an adjacent channel is fed the sacrificial material), or alternating channels are fed a similar material (e.g., every odd channel or every even channel is fed is either the silver paste or the sacrificial material).

At 106, the materials traverse through their respective channels. Parameters such as rate, temperature, duty cycle, etc. are set based at least in part on factors such as material viscosity and/or desired characteristics such as grid line length, width, strength, resistance, etc. In addition, these parameters are set to produce a laminar flow for each material traveling through each of the channels. At 108, a plurality of flows from the plurality of channels within each applicator is merged into a single flow of alternating materials (e.g., silver paste, sacrificial material, silver paste, sacrificial material, . . . or sacrificial material, silver paste, sacrificial material, silver paste, . . . ). Since each flow is a laminar flow, the materials merge with reduced mixing relative to non-laminar flows. The sacrificial material is preferably, but is not limited to, a material with a closely matched rheology to that of the silver paste.

At 110, the merged materials are dispensed from each of the applicators and applied to the photovoltaic substrate to create grid lines. It is to be appreciated the device and applicators and/or the photovoltaic substrate can be moved relative to the other. The device can be used multiple times in order to create a desired width and/or apply a desired number of layers, for example, for introducing barrier layers onto the photovoltaic substrate like a metal bi-layer with one metal making contact with the substrate as a diffusion barrier and another metal formed over it to reduce cost and/or increase conductance. The grid lines can be further processed, for example, via a heat treatment or sintering to make Ohmic contact with the substrate.

Using the applicator 12 for the grid lines results in grid lines with a high aspect ratio such as up to about 10:1 and relatively fine features such as less than about 5 to 10 microns. Conventional solar cell producing systems are not able to produce grid lines with such aspect ratios and feature size. With conventional systems, the grid lines cover about 4% of the area and are opaque and metallic and, thus, block photons from entering the semiconductor 64. The high aspect ratio fine feature grid lines produced via the applicator 12 take up less than 4% of the area and allow more photons to enter the semiconductor 64, which improves electrical power output. A further advantage arises because narrow grid lines have a smaller metal-to-semiconductor contact area, which has the beneficial effect of reducing electron-hole recombination.

Figure 9:
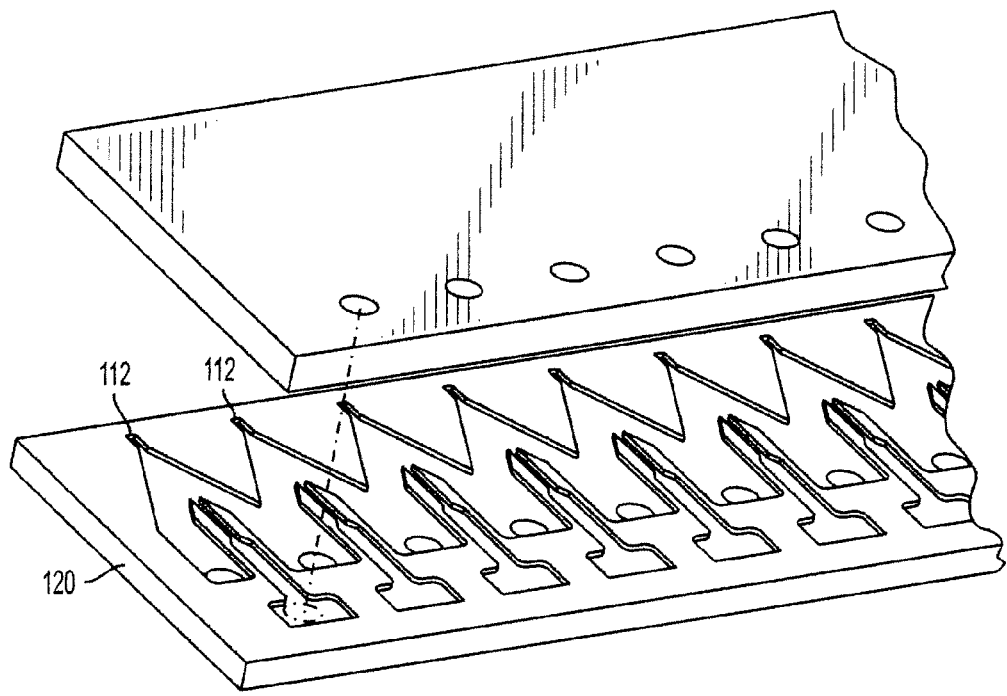
FIG. 9 illustrates an exploded view of a portion of an exemplary applicator for deposition of solar cell gridlines.
Figure 10:
FIG. 10 illustrates a cross section of gridlines dispensed via the applicator of FIG. 9.

FIG. 9 illustrates an exploded view of a portion of a co-extrusion/dispense applicator suitable for the deposition of solar cell gridlines. The applicator includes an array of outlets 112. Each of the outlets 112 corresponds to a single gridline and dispenses a material composite consisting of a central metal line of high aspect ratio with supporting material adjacent to one or more sides of the metal line. FIG. 10 depicts a cross section of two such gridlines dispensed via the applicator of FIG. 9 on a substrate 120. Each of the dispensed gridlines includes a metal line 116 and support material 118. Returning to FIG. 9, a convergent path 120 leading to each outlet 112 has advantages in comparison to a straight channel. For example, the extruded features can be finer than the finest minimum design feature of the applicator itself. In addition, the applicator uses less material to support the gridline compared to one that uses a single outlet.

By way of example, a co-extrusion applicator with the estimated parameters illustrated in Table 1 could be used to dispense the materials to make gridlines on a crystalline silicon solar cell.

TABLE 1

Exemplary applicator parameters for generating a gridline.

| | |
|---|---|
| Sheet Thickness | 152 microns |
| Gridline Pitch | 2.5 mm |
| Applicator Speed | 1 cm/sec |
| Past Viscosity | 100,000 Cp |
| Applicator Angle | 45 degrees |
| Applicator Exit Width | 304.8 Microns |
| Silver Width | 49.2 Microns |
| Silver Line Cross Section | 7,500 microns$^2$ |
| Silver Line Aspect Ratio | 3.10:1 |
| Silver Flow | 0.075 mm$^3$/sec |
| Applicator Compression | 6.2:1 |
| Applicator Pressure Drop | 2.24 atm |

With this design, convergent channels are patterned into a sheet of material with a thickness of approximately 0.15 mm. The output orifices of the applicator/nozzles are repeated on a pitch of 2.5 mm. At an applicator/nozzle pressure of approximately 2.24 atmospheres, paste of 1000 poise is ejected at a rate of 1 cm/sec. The central stripe of silver is approximately 50 microns wide with an aspect ratio of 3.1.

It will be appreciated that an applicator/nozzle with many separate outputs may have an inherent instability, particularly when the fluid being dispensed undergoes large amounts of shear thinning. This instability could cause fluids in different channels to divide into different flow states. For example, the flows could divide into a low flow, low shear, high viscosity state in some channels while others have a high flow, high shear, low viscosity state. A particularly undesirable condition is one in which for a given fluid displacement rate, the overall pressure drop is lowest for a combination of high and low output flows. One way to avoid uneven flows from a dispense nozzle with multiple outputs (such as the applicator of FIG. 9) is to drive each output from a separate fluid pump. A particularly desirable and cost effective way to achieve this is to create an array of positive displacement pumps in which fluid in multiple reservoirs is simultaneously compressed by a single actuator, such as a motor and lead screw driving a plate with multiple plungers.

Figure 11:
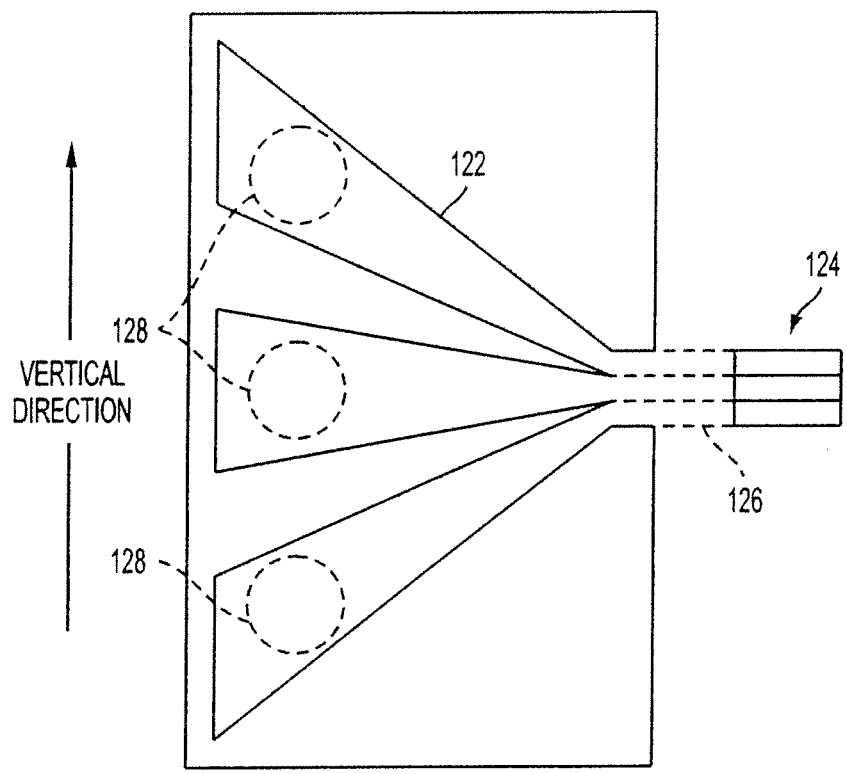
FIG. 11 illustrates a portion of an exemplary applicator with vertically positioned sub-channels for creating vertically layered entities.
Figure 12:
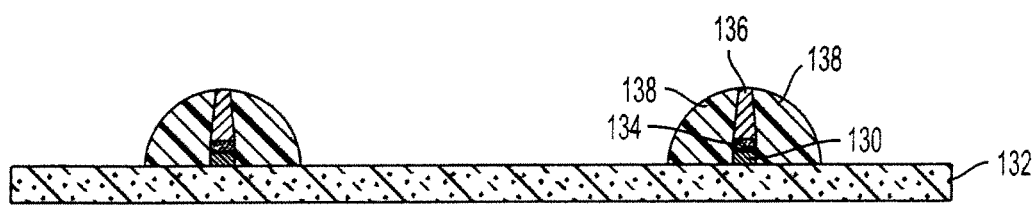
FIG. 12 illustrates a cross section of gridlines dispensed via the applicator of FIG. 11.

A further refinement of the arrayed lateral co-extrusion device described above in FIG. 9 includes the addition of manifolds directed at the introduction of vertically layered laminar flows of materials. FIG. 11 illustrates such an applicator in which a channel includes two or more sub-channels 122 positioned vertically with respect to each other to generate a vertically layered entity 124 via an exit port outlet 126. Each of the sub-channels includes an inlet 128 for introducing a material. The applicator can include a plurality of the channels with a similar and/or different number of sub-channels 122 to concurrently form horizontal and vertical layers. The foregoing structure facilitates lowering the metallization cost of solar cells. By way of example, as shown in FIG. 12, the vertically layered entity 124 includes a comparatively expensive contact material 130 such as a silver gridline metallization is formed adjacent to the substrate 132. A layer such as a nickel metallization that acts as a diffusion barrier 134 is formed vertically adjacent to the contact material 130. Vertically layered over the diffusion barrier 134 is a metal line 136 such as a layer of copper metallization that serves as an additional low cost material to carry current generated by the solar cell. A support material 138 is formed horizontally adjacent to the contact material 130, the diffusion barrier 134, and/or the metal line 136.

Figure 13:
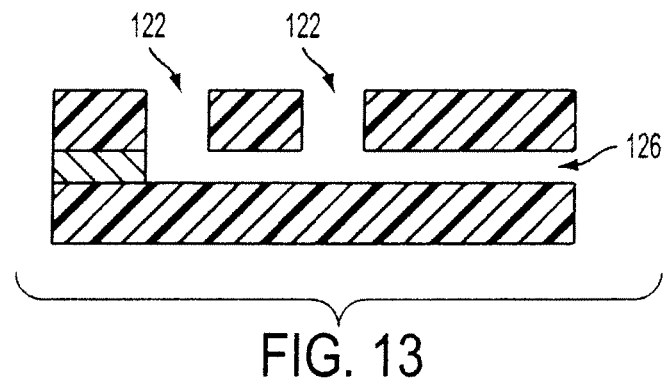
FIG. 13 illustrates an alternative configuration for producing a vertically layered entity in which flows are vertically merged and dispensed.
Figure 14:
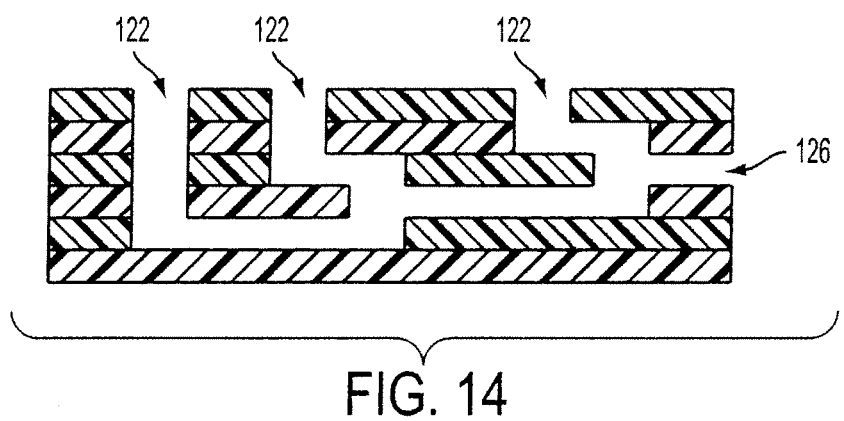
FIG. 14 illustrates another alternative configuration for producing a vertically layered entity in which flows are vertically merged together pair-wise.

FIGS. 13 and 14 illustrate various vertical co-extrusion/dispense configurations. In FIG. 13, the vertical flows through the sub-channels 122 can be simply merged together and dispensed at the outlet 126 as shown. Alternatively, the sub-channels 122 can converge together in order to produce finer features and to lessen to the total pressure drop for a given flow rate. For example, in FIG. 14, one layer of a stack of bonded plates is shown. On this layer, flows through the sub-channels 122 converge vertically. Layers above and below may contain filling orifices. Additional layers above and below can be introduced and merge the laterally disposed flows of sacrificial material.

Figure 15:
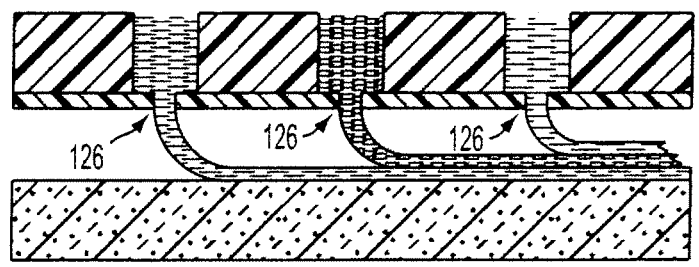
FIG. 15 illustrates another alternative configurations for producing vertically layered entities in which flows are vertically merged together external to the applicator.

An alternate device and method for producing a multilayer stack of dispensed metals on a substrate is illustrated in FIG. 15. In this device, individual layers from the outlets 126 are combined external to the dispense head in such a fashion that as the substrate moves relative to the dispense head, layers of dispensed paste lay on top of one another. This device has the potential advantage of producing less mixing.

Figure 16:
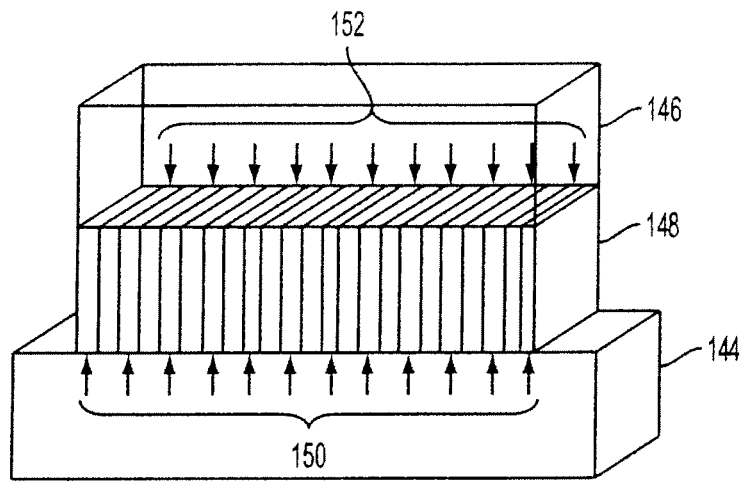
FIG. 16 illustrates a portion of an exemplary fuel cell with at least one channel created via the applicator described in FIG. 1.

FIG. 16 illustrates an exemplary fuel cell anode with at least one channel created via the applicator of FIG. 9. It is to be appreciated that the applicator of FIG. 9 can be used to create barrier channels and/or electrodes for other electrochemical devices such as batteries (e.g., zinc-air), etc.

The fuel cell anode includes a porous electrode and gas diffusion layer 144, a membrane 146 consisting of for example phosphoric acid bound in a polymer structure, and composite porous electrode 148 disposed there between. The electrode 144 typically is a porous electrode and gas diffusion layer which allows reactants, such as oxygen for a hydrogen fuel cell, to permeate into the composite porous electrode 148. The composite porous electrode 148 consists of alternating vertical stripes of nanoporous hydrophobic material (e.g., polytetrafluoroethylene particles) 150 and nanoporous hydrophobic conductor and catalyst 152 (e.g., graphite particles and platinum). A catalyst, such as platinum, in the conductor lines 152 catalyzes the reaction to produce water. In one instance, the reaction is characterized by the following:

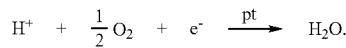

$$H^+ + \frac{1}{2}O_2 + e^- \xrightarrow{pt} H_2O.$$

The porous nature of the stripes 150 and 152 provide for continuous replenishment of the reactants consumed within the composite porous electrode 148.

Relatively high aspect ratio (10:1) thin feature (5-10 microns) porous lines are desirable because they produce a long reaction zone that increases utilization of the expensive catalyst needed for the electrode. However, conventional extrusion techniques cannot fabricate such lines on relatively rough (0.01 mm RMS) substrates at costs below $1/square foot. In addition, the structure should facilitate conducting protons form the membrane to the reaction site, diffusing oxygen to the reaction site with low partial pressure drop, conducting electrons from the porous electrode to the reaction site, carry heat away from the reaction site, and withstand a compressive mechanical load of 100-200 PSI. The challenges imposed by the electrode structure and its target cost place nearly impossible demands on conventional photolithographic, direct marking, and molding techniques. To compensate for this deficiency, conventional techniques commonly use more catalyst than desired to increase the number of reaction sites and/or employ agglomerates of carbon catalyzed with Platinum in a matrix of a porous material, or polytetrafluoroethylene (PTFE). The applicator of FIG. 9 can be used to produce high aspect-ratio (10:1) thin conductor lines 150 interleaved with porous PTFE 152 (5 microns or less) on relatively rough (0.01 mm RMS) substrates at costs below $1/square foot.

Figure 17:
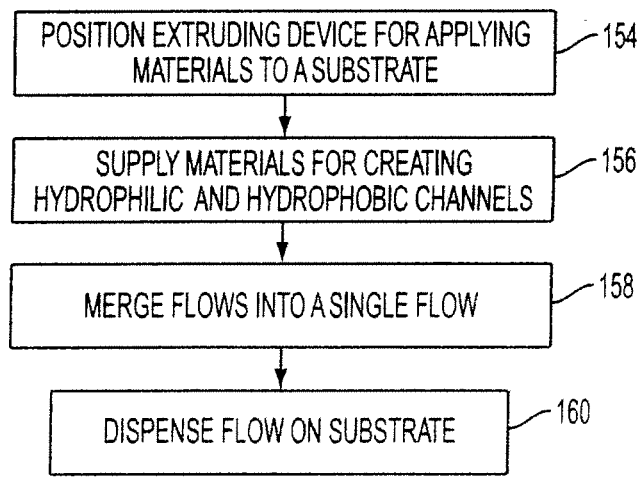
FIG. 17 illustrates a method for fabricating the electrode of the fuel cell described in FIG. 13.

FIG. 17 illustrates a method for fabricating the membrane electrode assembly of the fuel cell described in FIG. 16. At 154, suitably position a device employing the applicator of FIG. 9 with respect to a surface of a substrate. Such positioning includes a distance between dispensing ends of the applicators and the photovoltaic device, an angle of the dispensing ends of the applicators with respect to the photovoltaic substrate, etc. It is to be appreciated that more than one of the applicators can be concurrently used. In addition, the one or more applicators can be coupled in a serial (e.g., staggered or non-staggered) and/or parallel manner in order to increase the width of each pass and/or concurrently apply multiple layers.

At 156, a first material for creating the hydrophilic lines, and a second material for creating the hydrophobic lines are fed into the applicator(s). Each of the applicators can include a plurality of channels fabricated to facilitate producing laminar flow for merging materials within the applicators while mitigating mixing of such materials. The first and second materials typically are fed in an interleaved manner such that adjacent channels are fed different materials, or alternating channels are fed a similar material. Parameters such as rate, temperature, duty cycle, etc. are set based at least in part on factors such as material viscosity and/or desired characteristics such as grid line length, width, strength, resistance, etc. In addition, these parameters are set to produce a laminar flow for each material traveling through each of the channels.

At 158, a plurality of flows from a plurality of channels within each applicator is merged into a single flow of alternating materials (e.g., first material, second material, first material, second material, . . . or second material, first material, second material, second material, . . . ). Since each flow is a laminar flow, the materials merge with reduced mixing relative to non-laminar flow flows. At 160, the merged materials are dispensed from the applicator(s) to create a plurality of channels the form the electrolyte. It is to be appreciated that the applicator(s) and/or substrate can be moved relative to the other. The applicator(s) can be used multiple times in order to create a desired width and/or apply a desired number of layers.

To further reduce the mixing of pastes and the particles that the materials include, the materials can be formulated such that they are substantially immiscible. The particles that form the network of porous media in the electrode can be coated, if necessary, with hydrophilic or hydrophobic coatings to affect their intermixing. For instance, both pairs and combinations of liquids and colloidal suspensions can be made to be mutually insoluble, enabling striped layers of these materials to be extruded onto the substrate through the applicator without substantial mixing.

Table 2 provides examples of throughput related parameters for the applicators described herein. It is to be understood that these examples are provided for illustrative purposes and are not limiting. The throughput related parameters were obtained by estimating a pressure gradient to produce a Poiseuille flow in a rectangular cross section at various points along a length of the applicator 12.

TABLE 2

Throughput related parameters for the applicators described herein.

| | |
|---|---|
| Ejector Convergence | 10 to 1 |
| Injector Pitch | 50 microns |
| Injector Size | 25 microns |
| Array Width | 1000 injectors |
| Number of applicators | 10 nozzles |
| Applicator Height | 200 microns |
| Page Print Time | 1 minutes |
| Page size | 300 mm |
| Layer Thickness | 50 microns |
| Exit Pitch | 5 microns |
| Array width | 50 mm at input |
| Applicator width | 5 mm at output |
| Applicator speed | 30 mm/sec |
| Applicator flow speed | 7.5 mm/sec |
| Applicator flow rate | 7.5 mm^3/sec |
| Viscosity | 5000 cP or 5 kg/m.sec |
| Flow Rate | 7.5 mm^3/sec or 7.5E–09 m^3/sec |
| Applicator length | 50 mm |
| Pressure Drop | 24 PSI |

From Table 2, for a modest number of applicators, for example, about 10, and a pressure of about 24 PSI, a relatively highly viscous material could be printed at a rate of about 1 square foot per minute. The injector pitch at the wide end of the applicator is about 50 microns, and the width converges from about 50 mm to about 5 mm, with about 1000 injection ports, and a printed pitch at the applicator opening of about 5 microns. The height of the layer deposited by the applicator is about 50 microns, whereas the applicator channel is about 200 microns deep. The deposited layer is thinned by stretching, or moving the substrate faster (e.g., about four-times) than the flow rate of the materials as they leave the applicator. Depending on the properties of the materials, it may be possible to stretch a bead by relatively large ratios. For example, if the applicator channel is about 500 microns deep, and the layer thickness is about 50 microns, a substantially similar print speed can be achieved with a pressure drop of only about 1.7 PSI. For finer pitch, the applicator can include more injection ports or a narrower opening.

It will be appreciated that variations of the above-disclosed and other features and functions, or alternatives thereof, may be combined into other similar and/or different systems or applications. Also, unforeseen or unanticipated alternatives, modifications, variations or improvements therein, which are also intended to be encompassed by the following claims, may be made by those skilled in the art.

The invention claimed is:

1. An intermediate structure comprising:
a substrate; and
a plurality of parallel gridlines on the substrate, wherein each of the plurality of parallel gridlines includes:
a central line structure comprising a first non-Newtonian fluid and having an aspect ratio, wherein the first non-Newtonian fluid comprises a silver paste, and
a sacrificial support structure comprising a second non-Newtonian fluid, wherein the second non-Newtonian fluid is in contact with the first non-Newtonian fluid such that side portions of the sacrificial support structure contact opposing side edges of the central line structure, wherein the second non-Newtonian fluid is configured to maintain a cross sectional shape of the central line structure, and
wherein each sacrificial support structure is localized to only a single gridline;
wherein the central line structure of all of the plurality of parallel gridlines cover less than 4% of a surface area of said substrate.

2. The intermediate structure of claim 1, wherein the central line structure of each of the plurality of parallel gridlines has an aspect ratio greater than 2:1.

3. The intermediate structure of claim 1, wherein the central line structure of each of the plurality of parallel gridlines has a width in the range of 100 nanometers to 100 microns.

4. The intermediate structure of claim 1, wherein both the central line structure and the sacrificial support structure of each of the plurality of parallel gridlines are in direct contact with a surface of the substrate.

5. The intermediate structure of claim 1, wherein the second non-Newtonian fluid has substantially the same rheology to that of the silver paste.

6. An intermediate structure comprising:
a substrate having a surface with a plurality of
elongated composite structures on the surface of the substrate, each
composite structure comprising a central line structure:
the central line structure comprising a first co-extruded non-Newtonian fluid,
wherein the first co-extruded non-Newtonian fluid comprises a silver paste, and
a sacrificial support structure comprising a second co-extruded non-Newtonian fluid that is disposed on the central line structure such that side portions of the support structure are horizontally adjacent to the central line structure without substantial intermixing of the first co-extruded non-Newtonian fluid and second co-extruded non-Newtonian fluid, and wherein the second co-extruded non-Newtonian fluid is configured to maintain a cross sectional shape of the central line structure,
wherein both the side portions of the sacrificial support structure and the central line structure are in direct contact with the surface of the substrate, and wherein each sacrificial support structure is localized to only a single central line structure;
wherein the plurality of central line structures cover less than 4% of a surface area of said substrate.

7. The intermediate structure of claim 6, wherein the central line structure has an aspect ratio greater than 2:1.

8. The intermediate structure of claim 6, wherein the central line structure has a width in the range of 100 nanometers to 100 microns.

9. The intermediate structure of claim 6, wherein the second non-Newtonian fluid has a closely matched rheology to that of the silver paste.

10. The intermediate structure of claim 6, wherein the central line structure comprises a multilayer stack.

11. The intermediate structure of claim 6, wherein the support structure is configured to be removed after any one of drying, curing and sintering.

* * * * *